United States Patent
Choi (10) Patent No.: US 6,558,986 B1
(45) Date of Patent: May 6, 2003

(54) METHOD OF CRYSTALLIZING AMORPHOUS SILICON THIN FILM AND METHOD OF FABRICATING POLYSILICON THIN FILM TRANSISTOR USING THE CRYSTALLIZATION METHOD

(75) Inventor: Duck-Kyun Choi, Seoul (KR)

(73) Assignee: LG.Philips LCD Co., Ltd, Seoul (KR)

( * ) Notice: Subject to any disclaimer, the term of this patent is extended or adjusted under 35 U.S.C. 154(b) by 0 days.

(21) Appl. No.: 09/212,164

(22) Filed: Dec. 15, 1998

Related U.S. Application Data (63) Continuation-in-part of application No. 09/170,625, filed on Oct. 13, 1998.

(30) Foreign Application Priority Data

Sep. 3, 1998 (KR) .............................. 98-36208

(51) Int. Cl.⁷ ........................... H01L 21/00; H01L 21/84
(52) U.S. Cl. ...................... 438/149; 438/151; 438/166; 438/755; 438/799
(58) Field of Search ................................ 438/149, 151, 438/166, 755, 799

(56) References Cited

U.S. PATENT DOCUMENTS

| | | |
|---|---|---|
| 5,147,826 A | 9/1992 | Liu et al. |
| 5,275,851 A | 1/1994 | Fonash et al. |
| 5,403,763 A | 4/1995 | Yamazaki |
| 5,403,772 A | 4/1995 | Zhang et al. |
| 5,426,064 A | 6/1995 | Zhang et al. |
| 5,481,121 A | 1/1996 | Zhang et al. |
| 5,488,000 A | 1/1996 | Zhang et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,550,070 A | 8/1996 | Funai et al. |
| 5,569,610 A | 10/1996 | Zhang et al. |
| 5,595,944 A * | 1/1997 | Zhang et al. ............... 437/141 |
| 5,796,456 A * | 8/1998 | Takatori et al. ............ 349/117 |
| 5,847,780 A * | 12/1998 | Kim et al. .................... 349/39 |
| 5,994,174 A * | 11/1999 | Carey et al. ................ 438/166 |
| 6,066,547 A * | 6/2000 | Maekawa .................... 438/486 |

OTHER PUBLICATIONS

Kyung–Sub Song et al., "Electric Field Effect on the Metal Induced Crystallization of A–Si" Proceedigns of the Eight International Symposium on SOI Tech and Devices, vol. 97–23, pp. 75–80, Aug. 31, 1997.*

K.S. Song, S.H. Park, S.I. Jun and D.K. Choi, "A Crystallization of the Amorophous Silicon Using Field Aided Lateral Crystallization" Department of Inorganic Materials Engineering, Hanyang University, 1997, pp. 144–150.

(List continued on next page.)

*Primary Examiner*—Olik Chaudhuri
*Assistant Examiner*—Khiem Nguyen
(74) *Attorney, Agent, or Firm*—McKenna Long & Aldridge LLP (57) ABSTRACT

A method of crystallizing an amorphous silicon thin film is disclosed including the steps of preparing a substrate having a conductive layer, depositing an amorphous silicon thin film on the substrate, forming a metal thin film selectively overlying the amorphous silicon thin film, and performing a heat treatment and application of electric field to the metal thin film; and a method of fabricating a thin film transistor including the steps of preparing a substrate having a conductive layer, forming an active layer of amorphous silicon on the substrate, forming a gate insulating layer and a gate electrode on the active layer, doping the active layer with a first conductivity type impurity using the gate electrode as a mask, forming a metal thin film on the entire surface of the substrate including the active layer doped with the impurity, and performing a heat treatment and applying electric field to the substrate including the metal thin film.

61 Claims, 6 Drawing Sheets

OTHER PUBLICATIONS

Materials Research Society, Abstracts, Apr. 13–17, 1998, p. 55.

Kyung–Sub Song and Duck–Kyun Choi, "Electric Field Effect on the Metal Induced Crystallization of Amorophous Silicon," Proceedings of the Eighth International Symposium on Silicon–on Insulator Technology and Devices, vol. 97–23, pp. 75–80, Aug. 31, 1997.

Kyung–Sub Song, Seung–Ik Jun, Sang–Hyun Park and Duck–Kyun Choi, "I–V Characteristics of Poly–Silicon Thin Film Transistors By Field Aided Lateral Crystallization (FALC)," 5th International Conference on VLSI and CAD, Oct. 13–15, 1997, pp. 187–189.

Seung–Ik Jun, Kyung–Sub Song, Sang–Hyun Park and Duck–Kyun Choi, "Fabrication of Low Temperature Poly–Silicon Thin Film Transistor Using Field Aided Lateral Crystallization (FALC)," The First Asian–European International Conference on Plasma Surface Engineering, Oct. 5–9, 1997.

Kyung–Sub Song, Seung–Ik Jun, Sang–Hyun Park and Duck–Kyun Choi, "Enhanced Crystallization of Amorophous Silicon Using Electric Field," Proc. of the 12th KACG Tech. Meeting and the 4th Korea–Japan, EMGS, Jun. 12, 1997.

Y. Masaki, P. G. LeComber, and A. G. Fitzgerald, "Solid Phase Crystallization of Thin Films of Si Prepared by Plasma–Enhanced Chemical Vapor Deposition," *J. Appl. Phys.* 74(1), Jul. 1, 1993, pp. 129–134.

Dong Kyun Sohn, Jeong No Lee, Sang Won Kang and Byung Tae Ahn, "Low–Temperature Crystallization of Amorophous Si Films By Metal Adsorption and Diffusion," *Jpn. J. Appl. Phys.* vol. 35 (1996) Pt. 1, No. 2B, pp. 1005–1009.

Jai II Ryu, Hyun Churl Kim, Sung Ki Kim and Jin Jang, "A Novel Self–Aligned Polycrystalline Silicon Thin–Film Transistor Using Silicide Layers," IEEE Electron Device Letters, vol. 11, No. 6, Jun. 1997, pp. 123–125.

* cited by examiner

METHOD OF CRYSTALLIZING AMORPHOUS SILICON THIN FILM AND METHOD OF FABRICATING POLYSILICON THIN FILM TRANSISTOR USING THE CRYSTALLIZATION METHOD

This application is a continuation-in-part of application Ser. No. 09/170,625, filed Oct. 13, 1998.

BACKGROUND OF THE INVENTION

1. Field of the Invention

The present invention relates generally to a method of crystallizing an amorphous silicon thin film and to a method of fabricating a polycrystalline silicon thin film transistor using the crystallization method. More particularly, it relates to a method of crystallizing an amorphous silicon thin film by forming the amorphous silicon thin film on an insulating substrate and having the amorphous silicon undergo crystallization through heat treatment and application of an electric field, and further to a method of fabricating a polycrystalline silicon thin film transistor using the crystallization method including heat treatment and application of an electric field.

2. Discussion of the Related Art

Many studies have been conducted on polycrystalline silicon thin film transistors because of their high electric field mobility and current driving capability and, especially, the polycrystalline silicon thin film transistors that are commonly used in active matrix liquid crystal display of three-dimensional large integrated circuits. Crystal characteristics of silicon important in polycrystalline silicon thin film transistors since large integrated circuits are formed on the silicon thin film.

The effect of metals in crystallization of an amorphous silicon thin film has been studied. It is, for example, reported that a use of nickel leads to a decrease in the crystallization temperature to 480° C. (C. Hayzelden and L. D. Batone. "Silicide-mediated crystallization of nickel-implanted amorphous silicon thin films" J. Appl. Phys. vol. 73 no. 12 pp. 8279–8289, 1993).

Nickel silicide induces formation and growth of silicon seeds and diffusion of nickel seems to determine the crystallization speed of silicon. In addition, according to the Metal Induced Lateral Crystallization (MILC) method, a polycrystalline silicon thin film, less contaminated with metals can be produced as nickel silicide is diffused with heat and moves towards an area containing no metals.

The Field Assisted Lateral Crystallization (FALC) method has also been studied in relation to crystallization of an amorphous silicon thin film. FALC is a crystallization technique in which a lateral crystallization is accelerated in one direction depending on the polarity of electric field applied. In the FALC of silicon, the lateral crystallization is performed more rapidly in the negative (−) electrode than in the positive (+) electrode (Kyung-Sub Song, Duck-Kyun Choi, "Electric Field Effect On The Metal Induced Crystallization Of Amorphous Silicon", Electrochemical Society Proceedings Volume 97-23, pp75–80).

Figure 1:
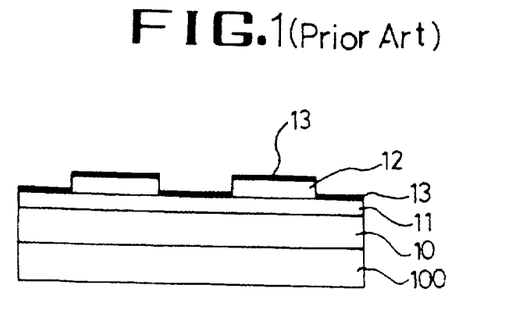
FIG. 1 is a section of sample used to achieve crystallization of silicon by way of electric field assisted lateral crystallization.

A section of a sample used in the FALC of silicon is shown in FIG. 1 and its fabrication will be described in connection with the figure as follows.

An oxide layer 10 is deposited as thick as about 5000 Å on a silicon wafer 100 doped with a first conductivity type impurity. An amorphous silicon thin film 11 to be crystallized is then deposited on the oxide layer 10 by the Plasma-Enhanced Continuous Vapor Deposition (PECVD) method, to a thickness of about 1000 Å. Subsequently, a silicon oxide layer about 1000 Å thick is deposited on the amorphous silicon thin film and etched by photolithography to form a pattern oxide layer 12 that has a defined profile to selectively expose part of the amorphous silicon thin film 11. As a catalyst in crystallization, a metal thin film 13 consisting of one or a combination of Ni, Fe, Co, Ru, Rh, Pd, Os, Ir, Pt, Se, Ti, V, Cr, Mn, Cu, Zn, Au, Ag, or alloys thereof is applied to a thickness in the range of 30 to 60 Å to the whole surface of the exposed substrate, thereby obtaining the sample as shown in the FIG. 1.

After forming an electrode on a part of the sample prepared, an electric field is applied to the electrode during a heat treatment so that the amorphous silicon thin film begins to be crystallized. Thus the metal thin film and a part of the amorphous silicon in contact with the metal thin film are crystallized by metal-induced crystallization during the heat treatment, with the crystallized silicon portion being grown laterally towards another part of the amorphous silicon not contacting the metal thin film. This lateral crystallization proceeds rapidly and uniquely in the negative (−) electrode relative to the positive (+) electrode due to effect of the electric field applied. As a consequence, it is possible to accelerate unidirectional crystallization of silicon by applying the electric field.

If the above-described prior art FALC is applied to the liquid crystal displays that include devices such as transistors fabricated on the insulating substrate, a desirable quality of crystallization could be achieved. Where an amorphous silicon thin film on the substrate of the thin film transistor is crystallized by FALC, a current path is required to be formed in the substrate in order to effect high quality crystallization. By applying an electrical voltage to the amorphous silicon thin film on the silicon wafer, a current path forms over the entire wafer, since the silicon wafer doped with a conductive impurity exhibits electrical conductivity. The current path provides a better crystallization conditions and then improves the crystallization quality of the silicon thin film on the wafer.

SUMMARY OF THE INVENTION

Accordingly, the present invention is directed toward a method of crystallizing an amorphous silicon thin film and a method of fabricating a polycrystalline silicon thin film transistor using the crystallization method that obviate the problems of the related art.

An object of the present invention is to provide a method of crystallizing an amorphous silicon thin film, in which a conductive layer is formed between an insulating substrate and the amorphous silicon thin film, and an electric field is applied to cause the crystallization of silicon on the insulating substrate with a current path by FALC, and a method of fabricating a thin film transistor using such a crystallization method.

In an embodiment of the present invention, a method of crystallizing an amorphous silicon thin film includes the steps of: preparing a substrate having a conductive layer; depositing an amphorous silicon thin film on the substrate; forming a metal thin film selectively overlying the amorphous silicon thin film; and performing a heat treatment and application of electric field to the metal thin film.

In another embodiment of the present invention, a method of fabricating a thin film transistor includes the steps of: preparing a substrate having a conductive layer; forming an active layer of amorphous silicon on the substrate; forming a gate insulating layer and a gate electrode on the active layer; doping the active layer with a first conductivity type impurity using the gate electrode as a mask; forming a metal thin film on the whole surface of the substrate including the active layer doped with the impurity; and performing a heat treatment and applying electric field to the substrate including the metal thin film.

DETAILED DESCRIPTION OF PREFERRED EMBODIMENT

FIGS. 2a–2f illustrate a first preferred embodiment of the present invention, which are step-by-step cross-sections illustrating a process for crystallizing an amorphous silicon thin film on a glass substrate in accordance with the present invention.

Figure 2A:
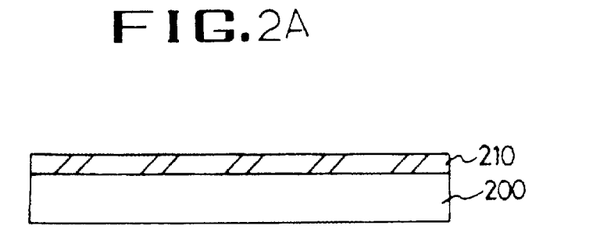
FIGS. 2a–2g are cross-sectional views for illustrating a first preferred embodiment of the present invention.

Referring to FIG. 2a, a conductive layer 210 is formed as thick as several hundred Å to several thousand Å, preferably, 500~2500 Å on an insulating substrate 200 by depositing a known conductive material such as transparent conductive material or metal conductive material on the entire surface of the insulating substrate 200 by continuous vapor deposition (CVD) or sputtering method. Examples of the transparent conductive material include Indium Tin Oxide (ITO) and Tin Oxide ($SnO_x$). Also, available metal conductive materials include one or a combination of Al, Cr, Mn, Fe, Co, Zn, Mo, Pd, Ru, Rh, Tc, Ag, Cd, In, Sn, Ta, W, Re, Os, Ir, Pt, Au or the like. The conductive layer 210 may be formed by an impurities doped amorphous silicon layer or an impurities doped polycrystalline silicon layer.

In an aspect of this, any material that exhibits electrical conductivity can be used as a material for the conductive layer 210. An insulating buffer layer is formed prior to deposition of the conductive layer 210 on the insulating substrate 200 so that it should be interposed between the insulating substrate 200 and the conductive layer 210.

Figure 2B:
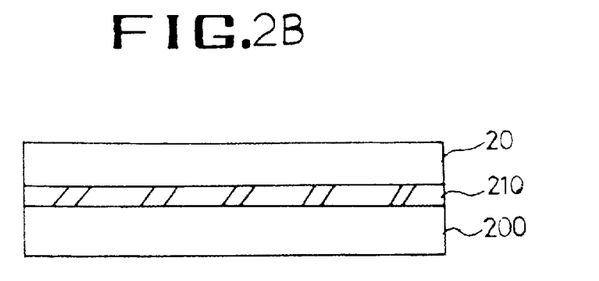

Referring to FIG. 2b, a first insulating layer 20 is deposited to have a thickness of about several thousands Å, preferably, 2000~5000 Å on the conductive layer 210. The first insulating layer 20 is formed by depositing a silicon oxide layer by CVD method, or by depositing a known insulating material.

Figure 2C:
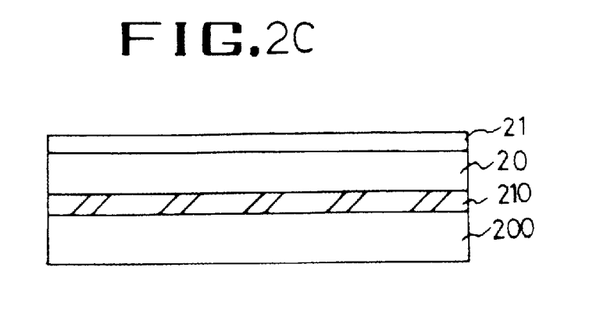

Referring to FIG. 2c, an amorphous silicon thin film 21 to be crystallized is deposited as thick as about several hundreds to several thousands Å, preferably, 500~4000 Å on the first insulating layer 20 by CVD method or sputtering method.

Figure 2D:
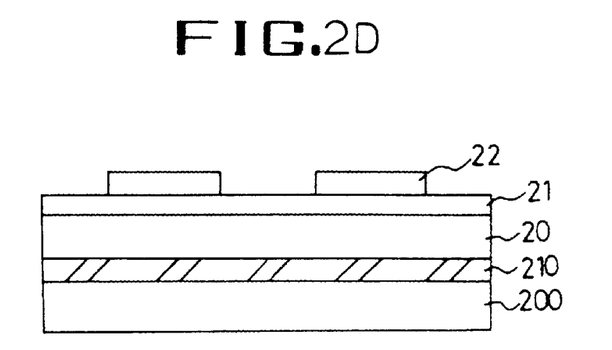

Referring to FIG. 2d, a silicon oxide layer having a thickness of about 500~3000 Å, preferably 1000 Å, is formed on the amorphous silicon thin film 21 by sputtering method or by CVD method and etched by photolithigraphy to form a pattern oxide layer 22 having a defined profile that selectively exposes part of the amorphous silicon thin film 21.

Figure 2E:
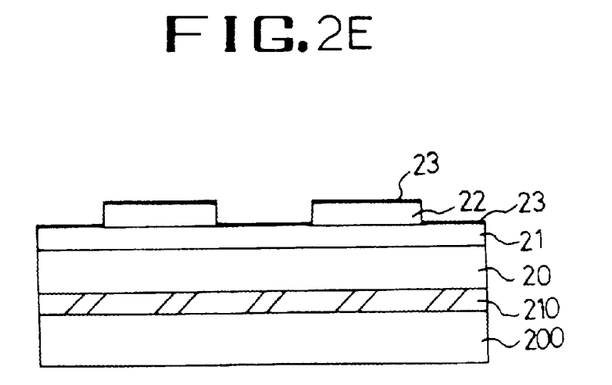

Referring to FIG. 2e, a metal thin film 23 Å, is deposited Å, preferably, 5~60 Å on the entire exposed surface of the substrate by sputtering method or evaporating method. The metal thin film is coated on the substrate by the spin coating method or by the dipping method. The metal thin film is formed by depositing a material to function as a catalyst in the crystallization of amorphous silicon. The metallic material used as a crystallization catalyst includes one or a combination of Cu, Ni, Fe, Co, Ru, Rh, Pd, Os, Ir, Pt, Se, Ti, V, Cr, Mn, Zn, Au, Ag, or their alloys.

Figure 2F:
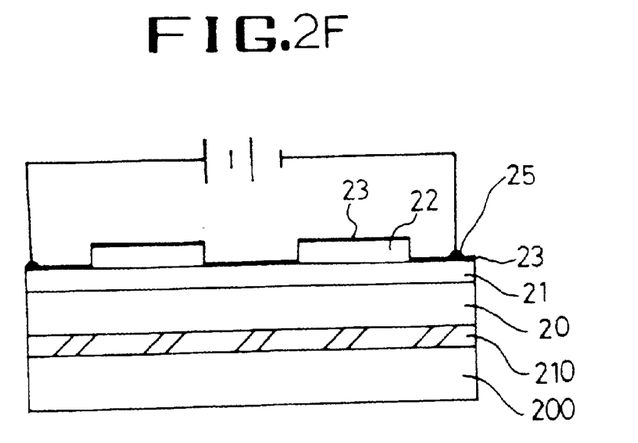

Referring to FIG. 2f, electrodes 25 to which the electric field will be applied is formed on the exposed metal thin film 23 and the electric field is applied to the electrodes 25 under conditions of heat treatment at a required temperature, so that the amorphous silicon thin film undergoes crystallization. The electrodes may be formed of one or a combination of Al, Cr, Mn, Fe, Co, Zn, Mo, Pd, Ru, Rh, Tc, Ag, Cd, In, Sn, Ta, W, Re, Os, Ir, Pt, Au or the.

Herein, the heat treatment may be carried out in an ambient having an inert gas or a reducing gas comprising $N_2$, $H_2$, Ar or the like or, a vacuum. Subsequently, the electric field of less than 10 v/cm several tens V/cm, preferably, 5~20 V/cm may be applied. The electric field is applied using either DC-voltage or AC-voltage. In the present invention heat treatment may be carried out at a temperature below 500° C., preferably, 350~500° C.

Figure 2G:
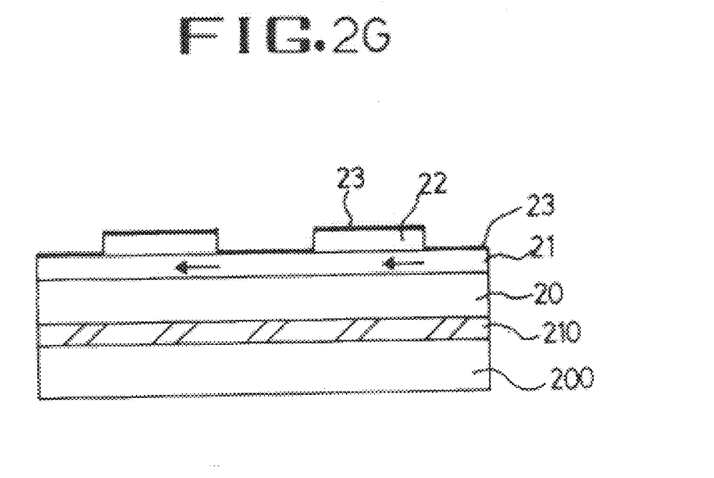

Referring to FIG. 2g, as a result of heat treatment and application of electric field, a silicon portion contacting the metal thin film 23 is crystallized, inducing lateral crystallization of the silicon portion not contacting the metal thin film 23.

At this stage, the silicon portion that does not contact the metal thin film is grown more rapidly, for example, by a factor of up to several tens of times in the negative (−) electrode than in the positive (+) electrode because of the electric field effect. Thus the electric field aids the unidirectional crystallization of silicon.

Although the conductive layer 210 is formed on the insulating substrate 200 in the aforementioned example of the present invention, there is no limitation upon the position of the conductive layer 210 with respect to the insulating substrate so long as a current path is formed in the insulating substrate. Thus the conductive layer 210 can be disposed underlying the insulating substrate 200, or overlying a second insulating layer on the insulating substrate 200, or interposed between the insulating substrate 200 and the amorphous silicon thin film 21. Any substrate can be employed as long as it has a conductive material that forms a current path.

There is no limitation on the position of the electrodes 25 as long as the electric field is applied to the resultant substrate by applying a voltage to the electrodes 25.

Taken for another example, the electrode may be formed on both the sides of the resultant substrate in which the insulating substrate 200, the conductive layer 210, the first insulating layer 20, the amorphous silicon layer 21 and thin film layer 23 are formed.

Also, the electrodes 25 to which an electric field will be applied can be formed on the metal thin film, between the amorphous silicon thin film 21 and the metal thin film 23, under the insulating substrate 200 opposing the amorphous silicon thin film 21 with respect to the insulating substrate 200, or under the amorphous silicon film 21. Or, the electrodes 25 may be formed connected to the conductive layer.

Although a specific temperature for the heat treatment is not given in this example, silicon may undergo crystallization at a temperature below 500° C. in the present invention.

Figure 3:
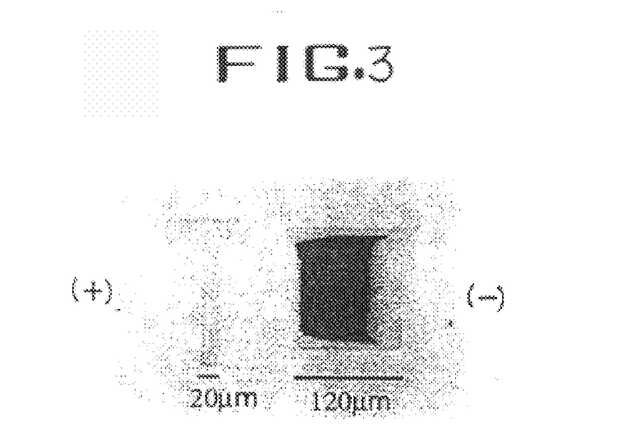
FIG. 3 shows the crystallization degree of silicon in the first preferred embodiment of the present invention.

FIG. 3 is an illustration of the resulting crystallized sample in the first preferred embodiment of the present invention.

After forming a conductive layer consisting of ITO on a glass substrate and disposing a first insulating layer made of silicon oxide on the conductive layer, an amorphous silicon thin film is deposited on the first insulating layer. A second insulating layer is disposed on the amorphous silicon thin film and etched by photolithography to form a pattern oxide layer that has a defined profile. A copper thin film is deposited on the entire surface of the substrate to prepare the sample. Subsequently, the sample undergoes a heat treatment at a temperature below 500° C. and an electric field is applied to the sample for one hour.

When subjected to the above-described conditions, the silicon begins to undergo crystallization, as shown in FIG. 3, in which the left side of the sample is connected to the positive (+) electrode and the right side is connected to the negative (−) electrode.

A lateral crystallization is fully achieved in the 20 μm pattern and an approximately 35 μm crystal appears in the 120 μm pattern. Further, a unidirectional lateral crystallization is shown in the 120 μm pattern which demonstrates the electric field effect. The crystal growth, as illustrated in the figure, proceeds from the negative (−) electrode towards the positive (+) electrode. Further, a current about 0.5 Å flows across the sample under a dc-voltage of 10 V applied during the heat treatment.

As described above, a conductive layer underlies the amorphous silicon to form the current path, which gives a better crystallization condition and also improves the crystallization quality of the crystallized silicon thin film. The conductive layer also induces unidirectional crystallization better than a typical glass substrate.

FIGS. 4a–4f illustrate a second preferred embodiment of the present invention, showing flow diagrams of a process for fabricating a thin film transistor in accordance with the present invention.

Figure 4A:
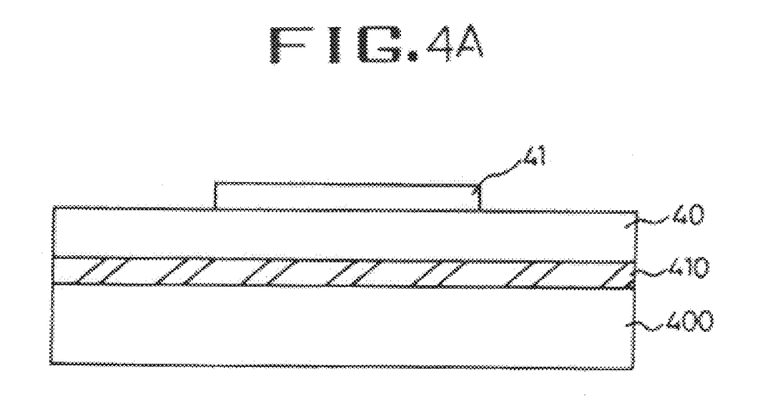
FIGS. 4a–4e are cross-sectional views for illustrating a second preferred embodiment of the present invention.

Referring to FIG. 4a, an ITO layer is deposited as thick as about several thousand Å, preferably 500~2500 Å on an insulating substrate 400 to form a conductive layer 410. The conductive layer 410 is formed by depositing a transparent conductive material or any known conductive material including a metal conductive material on the insulating substrate 400 by CVD or sputtering method. The conductive layer may be formed by transparent conductive material including ITO (Indium Tin Oxide) and $SnO_x$(Tin Oxide), or may be formed by one or a combination of metal conductive material including Al, Cr, Mn, Fe, Co, Zn, Mo, Pd, Ru, Rh, Tc, Ag, Cd, In, Sn, Ta, W, Re, Os, Ir, Pt, Au or the like, or an impurities doped amorphous silicon layer or an impurities doped polycrystalline silicon layer.

The conductive layer 410 used in the invention is formed from a material that exhibits electrical conductivity. The conductive layer can be formed to cover the whole substrate or patterned in a defined profile. An insulating buffer layer is formed prior to deposition of the conductive layer 410 on the insulating substrate 400 so that it should be interposed between the insulating substrate 400 and the conductive layer 40.

Subsequently, a first insulating layer 40 is formed as thick as about 5000 Å on the conductive layer 400 by depositing a known insulating layer such as a silicon oxide layer or a silicon nitride layer by CVD method. An amorphous silicon thin film with a thickness of between 500 Å and 4000 Å, preferably 1000 Å, is deposited 10000 Å on the first insulating layer 40 and etched by photolithography to form an active layer 41.

Figure 4B:
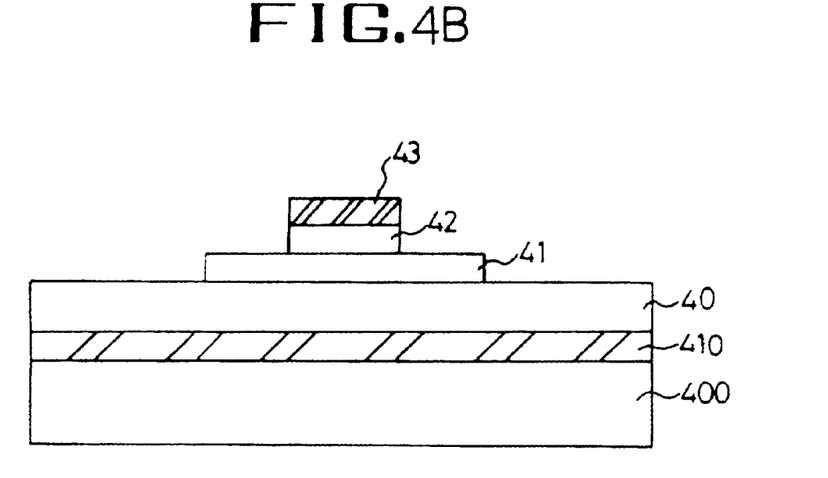

Referring to FIG. 4b, after sequential depositions of a second insulating layer and a first conductive layer on the active layer 41, the first conductive layer is etched by photolithography to form a gate electrode 43 and the underlying second insulating layer is etched to form a gate insulating layer 42.

The second insulating layer is formed by deposition of a known insulating layer such as a silicon nitride layer, with the first conductive layer being prepared by depositing a known conductive layer consisting of one or a combination of Al, Cr, Mn, Fe, Co, Zn, Mo, Pd, Ru, Rh, Tc, Ag, Cd, In, Sn, Ta, W, Re, Os, Ir, Pt, Au or the like.

Figure 4C:
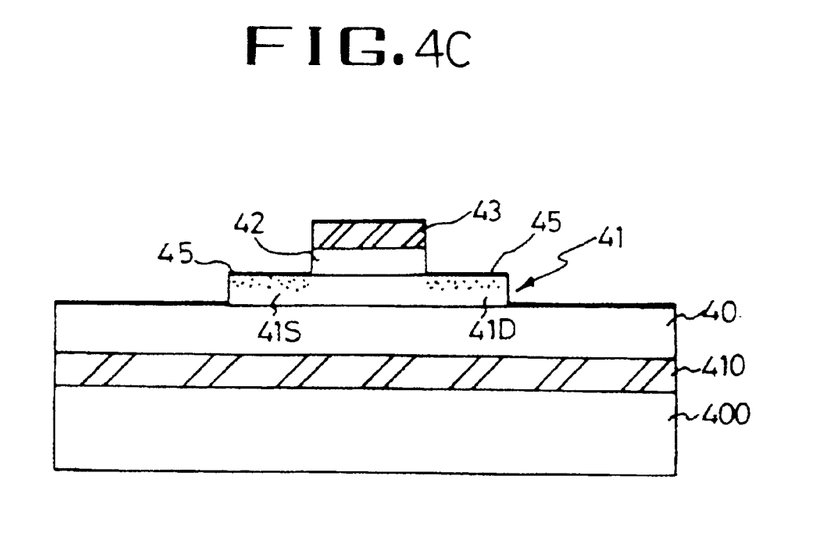

Referring to FIG. 4c, the entire surface of the substrate exposed is doped with N type or P type impurities to form source region 41S and drain region 41D in the active layer 41.

Then a copper thin film 45 is deposited to have a thickness below one hundred Å, preferably between 5 Å and 60 Å on the exposed substrate. Alternatively, the copper thin film 45 may be formed prior to the doping step. The copper thin film 45 is used as a catalyst in crystallization of amorphous silicon. As a substitute for the copper thin film 45 as a catalyst, it is possible to use another metal thin film consisting one or a combination of Ni, Fe, Co, Ru, Rh, Pd, Os, Ir, Pt, Se, Ti, V, Cr, Mn, Zn, Au, Ag, or their alloys. Reference numeral 41C denotes a portion of the thin film transistor defined as a channel region.

Herein the metal thin film is formed by sputtering method or evaporating method. Also, the metal thin film is coated on the substrate by the spin coating method or the dipping method. The metal thin film is formed by depositing a material to function as a catalyst in crystallization of amorphous silicon.

Figure 4D:
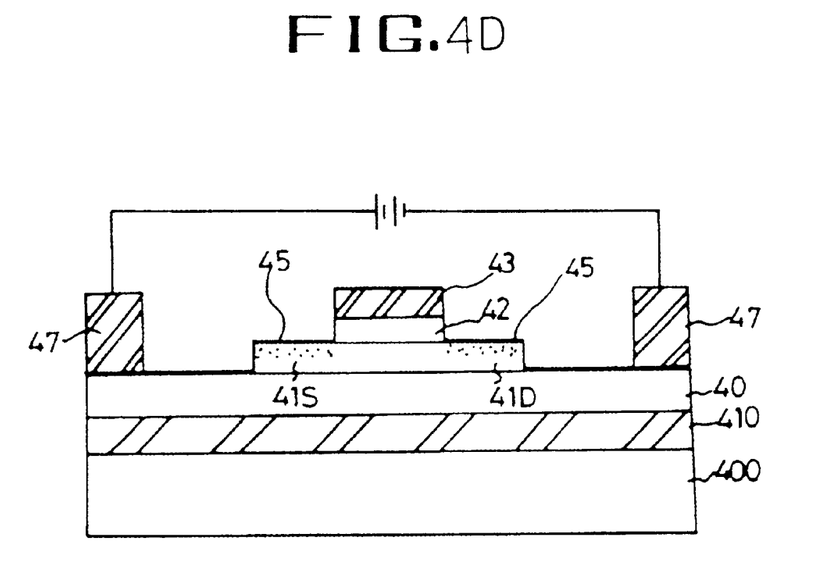

Referring to FIG. 4d, electrodes 47 to which a voltage will be applied is formed on the substrate including the copper thin film 45. The electrodes 47 can be formed from a metal consisting of a known metallic material including one or a combination of Al, Cr, Mn, Fe, Co, Zn, Mo, Pd, Ru, Rh, Tc, Ag, Cd, In, Sn, Ta, W, Re, Os, Ir, Pt, Au or the like.

Although the electrodes 47 are formed on the copper thin film 45 in this example, there is no limitation on the position of the electrode as long as the electric field is applied to the resultant substrate by applying the voltage to the electrode.

Taking another example, the electrode may be formed on both sides of the resultant substrate in which the insulating substrate, the conductive layer, the insulating layer, the amorphous silicon layer and thin film layer are formed.

Also, the electrode to which the electric field will be applied can be formed on the metal thin film, between the amorphous silicon thin film and the metal thin film, under the insulating substrate opposing the amorphous silicon thin film with respect to the insulating substrate, or under the amorphous silicon film. Or, the electrodes may be formed connected the conductive layer.

Next, the substrate is subjected to heat treatment at a temperature below 500° C., preferably, 350~500° C. and simultaneously voltage is applied to the electrodes 47, thereby applying an electric field to the substrate. Herein, the heat treatment may be carried out in an ambient environment having an inert gas or a reducing gas comprising $N_2$, $H_2$, Ar or the like or, the heat treatment may be applied in a vacuum. Further, the electric field of several to several tens V/cm, preferably 5~20 V/cm maybe applied to form a current of several Amperes (A), preferably below 3 A in the copper thin film. The electric field may be applied using a direct current source or an alternating current source or an alternating current source.

Figure 4E:
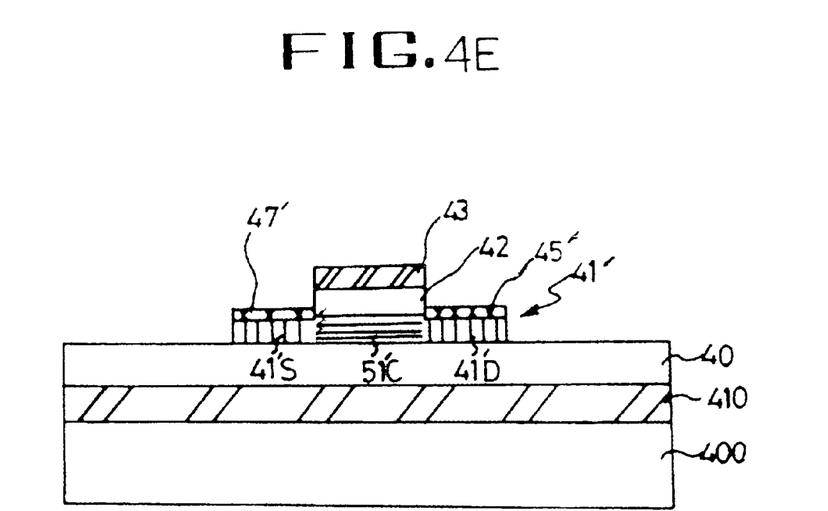

Referring to FIG. 4e, as a result of heat treatment and application of an electric field, the amorphous silicon thin film on the substrate is crystallized into a polycrystalline silicon thin film to provide a polycrystalline silicon thin film transistor. After this, source region 41S and drain region 41D, that are the portions of silicon active layer 41 contacting the copper thin film 45 are crystallized, inducing a lateral crystallization of channel region 41C that is the portion of silicon active layer 41 not contacting the copper thin film 45. At this stage, the channel region 41C is grown more rapidly in the direction of the negative (−) electrode than in the positive (+) electrode because of the electric field effect. It is demonstrated that the electric field aids unidirectional crystallization of silicon.

Although the conductive layer is formed on the insulating substrate in the aforementioned example of the present invention, there is no limitation on the position of the conductive layer with respect to the insulating substrate so long as a current path is formed in the insulating substrate. Thus the conductive layer can be disposed underlying the insulating substrate, or overlying a second insulating layer on the insulating substrate, or interposed between the insulating substrate and the amorphous silicon thin film. Any substrate can be employed as long as it has a conductive material that forms a current path.

Although a temperature for the heat treatment is not specifically given in this example, silicon can undergo crystallization at a relatively low temperature below 500° C. in the embodiment shown of the present invention.

Figure 5:
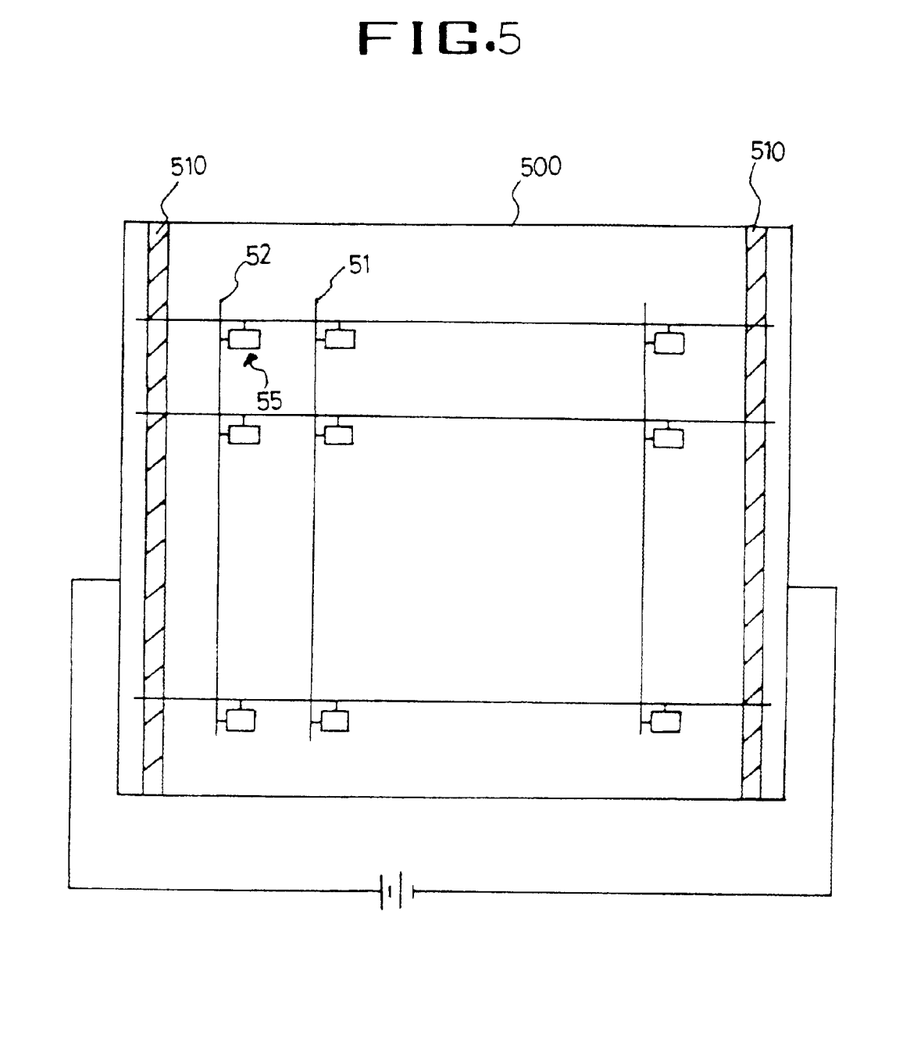
FIG. 5 is an illustration for a third preferred embodiment of the present invention.

FIG. 5 is a plan view schematic illustration of a third preferred embodiment of the present invention, schematically showing a conductive layer 510 used in fabrication of a liquid crystal display according to the present invention.

In a case where the conductive layer is made from an opaque conductive material, it is required to form the conductive layer so as to have a defined profile that allows a light to pass through a pixel electrode portion. For this, a conductive material is deposited on an insulating substrate 500 and subjected to a photo-etching to form a conductive layer 510. The conductive layer 510 shown in the figure can be overlapped with gate line 51 or data line 52. Although the gate line or data line can be formed separately from the conductive layer, it is possible to design a structure of liquid crystal display so that the gate line or data line can also be used as the conductive layer.

An insulating layer is formed to cover the whole surface of the substrate and amorphous silicon is subsequently deposited to form amorphous silicon thin film transistor 55, gate line 51 and data line 52. After depositing a metal thin film in a range of thickness of between 5 Å and 60 Å to cover the whole surface of the substrate, electrodes are formed in the substrate 500. The amorphous silicon is crystallized into polycrystalline silicon after heat treatment and application of electric field, thereby providing a polycrystalline silicon thin film transistor. A subsequent process is performed to fabricate a liquid crystal display.

As described above, a use of conductive layer formed to have a defined profile induces a crystallization of amorphous silicon. In a case where the conductive layer is made from a transparent conductive material, the conductive layer is deposited on the whole surface of the substrate to induce the growth of amorphous silicon without interfering with light transmission through the pixel electrode.

The present invention is applicable to crystallization of non-crystalline thin film as well as crystallization of an amorphous silicon thin film.

As in the present invention described above, silicon can be crystallized by FALC on an insulating substrate by use of a conductive layer, which makes it possible to fabricate a polycrystalline silicon thin film transistor on the insulating substrate using the FALC method. FALC of an amorphous silicon thin film on the insulating layer accelerates unidirectional crystallization of silicon due to the electric field effect. Furthermore, as a conductive layer consisting of opaque conductive material is patterned to have a defined profile in the present invention, it is possible to prepare a liquid crystal display having polycrystalline silicon thin film transistors without a reduction of light transmission efficiency. Particularly, the conductive layer can be used as a data line that attains an intended result of the invention without an additional process.

The foregoing invention has been described in terms of preferred embodiments. However, those skilled in the art will recognize that many variations of such embodiments exist. Such variations are intended to be within the scope of the present invention and the applied claims.

What is claimed is:

1. A method crystallizing an amorphous silicon thin film comprising the steps of:
   forming a conductive layer over a substrate;
   depositing the amorphous silicon thin film over the substrate and the conductive layer;
   forming a metal thin film selectively overlaying the amorphous silicon thin film; and
   performing a heat treatment while applying an electric field to the metal thin film and an electric current to the conductive layer.

2. The method of claim 1, wherein the substrate is prepared by forming the conductive layer on an insulating substrate.

3. The method of claim 1, wherein the substrate is prepared by forming the conductive layer underlying an insulating substrate.

4. The method of claim 2, further comprising the step of forming an insulating layer on the substrate.

5. The method of claim 3, further comprising the step of forming an insulating layer on the substrate.

6. The method of claim 1, wherein the amorphous silicon thin film is deposited to a thickness of between about several hundred Å and several thousand Å.

7. The method of claim 6, wherein the amorphous silicon thin film has a thickness of between 500 Å and 3000 Å.

8. The method of claim 6, wherein the metal thin film is formed by disposing a second insulating layer on the amorphous silicon thin film to selectively expose an amorphous silicon portion, wherein the metal thin film includes a metallic material.

9. The method of claim 1, wherein the conductive layer is formed from a transparent conductive material comprising ITO, $SnO_x$ or the like.

10. The method of claim 1, wherein the conductive layer is made from a metal conductive material comprising at least one of Al, Cr, Mn, Fe, Co, Zn, Mo Pd, Ru, Rh, Tc, Ag, Cd, In, Sn, Ta, W, Re, Os, Ir, Pt, and Au.

11. The method of claim 1, wherein the conductive layer is formed from one of an impurities doped amorphous silicon and an impurities doped polycrystalline silicon.

12. The method of claim 1, wherein the conductive layer has a thickness of between several hundred Å and several thousand Å.

13. The method of claim 12, wherein the conductive layer has a thickness of between 500 and 2500 Å.

14. The method of claim 1, wherein the metal thin film is formed from a metallic material comprising at least one of Cu, Ni, Fe, Co, Ru, Rh, Pd, Os, Ir, Pt, Se, Ti, V, Cr, Mn, Zn, Au, Ag, and alloys thereof.

15. The method of claim 1, wherein the metal thin film has a thickness below several ten Å.

16. The method of claim 15, wherein the metal thin film has a thickness of between 5 Å and 60 Å.

17. The method of claim 1, wherein the metal thin film is formed by one of a spin coating method and a dipping method.

18. The method of claim 1, wherein the heat treatment is carried out in one of an inert gas ambient environment, a reducing gas ambient environment comprising at least one of $N_2$, $H_2$, and Ar, and a vacuum.

19. The method of claim 1, wherein the heat treatment is carried out at a temperature below 500° C.

20. The method of claim 1, wherein the application of an electric field is performed by applying a voltage to the conductive layer.

21. The method of claim 1, wherein the electric field is applied at between one V/cm and several ten V/cm.

22. The method of claim 1, wherein the electric field is applied at between 5 V/cm and 20 V/cm.

23. The method of claim 1, wherein the electric field is applied using one of a direct current source and an alternating current source.

24. The method of claim 1, wherein the application of the electric field is performed by forming electrodes on the metal thin film and applying a voltage to the electrodes.

25. The method of claim 1, wherein the application of the electric field is performed by forming electrodes between the amorphous silicon thin film and the metal thin film and applying a voltage to the electrodes.

26. The method of claim 1, wherein the application of the electric field is performed by forming electrodes under the substrate and applying a voltage to the electrodes.

27. The method of claim 1, wherein the application of the electric field is performed by forming electrodes under the amorphous silicon thin film and applying a voltage to the electrodes.

28. The method as claimed in claim 1, wherein the application of electric field is performed by forming electrodes connected to the conductive layer.

29. A method of fabricating a thin film transistor comprising the steps of:

forming a conductive layer over a substrate;

forming an active layer of amorphous silicon over the substrate and the conductive layer;

forming a gate insulating layer and a gate electrode on the active layer;

doping the active layer with a first conductive type impurity using the gate electrode as a mask;

forming a metal thin film on the whole surface of the substrate including the impurity doped active layer; and performing a heat treatment while applying an electric field to the substrate including the metal thin film and an electric current to the conductive layer.

30. The method of claim 29, wherein the substrate is prepared by forming the conductive layer on an insulating substrate.

31. The method of claim 29, wherein the substrate is prepared by forming the conductive layer underlying an insulating substrate.

32. The method of claim 30, further comprising the step of forming an insulating layer on the substrate.

33. The method of claim 31, further comprising the step of forming an insulating layer disposed between the insulating substrate and the conductive layer.

34. The method of claim 29, wherein the amorphous silicon layer is deposited to a thickness of between several hundred Å and several thousand Å.

35. The method of claim 34, wherein the amorphous silicon layer has a thickness of between 500 Å and 4000 Å.

36. The method of claim 29, wherein the metal thin film is formed by disposing a second insulating layer on the amorphous silicon layer to selectively expose an amorphous silicon portion, wherein the metal thin film includes metallic material.

37. The method of claim 29, wherein the conductive layer is formed from a transparent conductive material comprising ITO, $SnO_x$ or the like.

38. The method of claim 29, wherein the conductive layer is made from a metal conductive material comprising at least one of Al, Cr, Mn, Fe, Co, Zn, Mo, Pd, Ru, Rh, Tc, Ag, Cd, In, Sn, Ta, W, Re, Os, Ir, Pt, Au and their alloys.

39. The method of claim 29, wherein the conductive layer is made from one of an impurities-doped amorphous silicon layer and an impurities-doped polycrystalline silicon layer.

40. The method of claim 29, wherein the conductive layer is formed from one of an impurities doped amorphous silicon and an impurities doped polycrystalline silicon.

41. The method of claim 29, wherein the conductive layer has a thickness of between several hundred Å and several thousand Å.

42. The method of claim 29, wherein the conductive layer has a thickness of between 500 Å and 2500 Å.

43. The method of claim 29, wherein the metal thin film is formed from a metallic material comprising at least one of Cu, Ni, Fe, Co, Ru, Rh, Pd, Os, Ir, Pt, Se, Ti, V, Cr, Mn, An, Au, Ag, and their alloys.

44. The method of claim 29, wherein the metal thin film has a thickness of of less than several ten Å.

45. The method of claim 44, wherein the metal thin film has a thickness of between 5 Å and 60 Å.

46. The method of claim 29, wherein the metal thin film is formed by one of a spin coating method and a dipping method.

47. The method of claim 29, wherein the heat treatment may be carried out in an ambient environment having one of an inert gas, a reducing gas comprising one of $N_2$, $H_2$, and Ar, and a vacuum.

48. The method of claim 29, wherein the heat treatment is carried out at a temperature below 500° C.

49. The method of claim 29, wherein the electric field is applied between several V/cm and several ten V/cm.

50. The method of claim 49, wherein the electric field is applied at between 5 V/cm and 20 V/cm.

51. The method of claim 29, wherein the electric field is applied at using one of a direct current source and an alternating current source.

52. The method of claim 29, wherein the application of the electric field is performed by forming electrodes on the metal thin film and applying a voltage to the electrode.

53. The method of claim 29, wherein the application of the electric field is performed by forming electrodes between the amorphous silicon thin film and the metal thin film and applying a voltage to the electrodes.

54. The method of claim 29, wherein the application of the electric field is performed by forming electrodes under the substrate and applying a voltage to the electrodes.

55. The method of claim 29, wherein the application of the electric field is performed by forming electrodes under the amorphous silicon thin film and applying a voltage to the electrodes.

56. The method as claimed in claim 29, wherein the application of electric field is performed by forming electrodes connected to the conductive layer.

57. A method of fabricating a thin film transistor of liquid crystal display having a pixel portion and signal line comprising the steps of:

forming a conductive layer of opaque material over a substrate in an area other than the pixel portion;

forming an amorphous silicon over the substrate and the conductive layer;

forming a metal thin film on the amorphous silicon; and performing a heat treatment while applying an electric filed to the substrate including the metal thin film.

58. The method of claim 57, wherein the conductive layer is overlapped with the signal line.

59. The method of claim 57, farther comprising a step of forming a first insulating layer on the conductive layer.

60. The method of claim 57, further comprising a step of forming an insulating buffer layer on the substrate.

61. The method of claim 57, further comprising a step of applying an electric current to the conductive layer during heat treatment.

* * * * *